(12) United States Patent
He et al.

(10) Patent No.: US 11,959,952 B1
(45) Date of Patent: Apr. 16, 2024

(54) ANECHOIC CHAMBER AND CONSTRUCTION METHOD THEREOF

(71) Applicant: Beijing Orient Institute of Measurement and Test, Beijing (CN)

(72) Inventors: Zibin He, Beijing (CN); Deqiang Song, Beijing (CN); Hao Xing, Beijing (CN); Huiru Zhang, Linyi (CN); Shujuan Song, Beijing (CN); Hao Chai, Beijing (CN); Zheng Li, Beijing (CN); Quan Chen, Beijing (CN); Yizhou Wang, Beijing (CN); Wenyu Cheng, Beijing (CN)

(73) Assignee: BEIJING ORIENT INSTITUTE OF MEASUREMENT AND TEST, Beijing (CN)

( * ) Notice: Subject to any disclaimer, the term of this patent is extended or adjusted under 35 U.S.C. 154(b) by 0 days.

(21) Appl. No.: 18/503,230

(22) Filed: Nov. 7, 2023

(30) Foreign Application Priority Data

Nov. 9, 2022 (CN) .......................... 202211396677.2

(51) Int. Cl.
*H01Q 17/00* (2006.01)
*G01R 29/08* (2006.01)
*G01R 29/10* (2006.01)

(52) U.S. Cl.
CPC ....... *G01R 29/0821* (2013.01); *G01R 29/105* (2013.01)

(58) Field of Classification Search
CPC . H01Q 1/38; H01Q 17/00; H05K 9/00; G01R 1/18; G01R 29/10; G01R 29/08; G01R 29/0821; G01R 29/105
See application file for complete search history.

(56) References Cited

U.S. PATENT DOCUMENTS

| | | | | |
|---|---|---|---|---|
| 5,631,661 A | * | 5/1997 | Sanchez | G01R 29/0821 343/703 |
| 6,437,748 B1 | * | 8/2002 | Burnside | G01R 29/105 343/703 |

(Continued)

OTHER PUBLICATIONS

Rui Chu et al., "BeiDou Navigation Antenna Test System Based on Conical Microwave Anechoic Chamber", "Environment Test Equipment", Aug. 25, 2018, pp. 103-107.

(Continued)

*Primary Examiner* — Tho G Phan
(74) *Attorney, Agent, or Firm* — Zhigang Ma

(57) ABSTRACT

An anechoic chamber and a construction method thereof are provided, the anechoic chamber includes a top surface, being a polygon; trapezoid surfaces, corresponding to edges of top surface, upper edge lengths of trapezoid surface being equal to edge lengths of top surface, trapezoid surfaces being connected to edges of top surface through the upper edges, the trapezoid surfaces being sequentially connected along a circumferential direction of top surface, and being at angle to the top surface; rectangular surfaces, corresponding to the trapezoid surfaces, upper edge lengths of rectangular surface being equal to lower edge lengths of trapezoid surface, rectangular surfaces being connected to the trapezoid surfaces through the upper edges, the rectangular surfaces being sequentially connected along a circumferential direction of the lower edges of trapezoid surfaces, and being perpendicular to the top surface; and an absorbing material, disposed on the top surface, the trapezoid surfaces and the rectangular surfaces.

7 Claims, 10 Drawing Sheets

(56) References Cited

U.S. PATENT DOCUMENTS

| | | | | |
|---|---|---|---|---|
| 8,344,932 B2* | 1/2013 | Liu | ............... | H01Q 17/00 |
| | | | | 342/4 |
| 8,436,777 B2* | 5/2013 | Ito | ............... | G01R 29/10 |
| | | | | 343/703 |
| 11,476,956 B2* | 10/2022 | Liu | ............... | H04B 17/16 |

OTHER PUBLICATIONS

CNIPA, Notification of First Office Action for CN202211396677.2, dated Apr. 12, 2023.
Beijing Orient Institute of Measurement and Test (Applicant), Reply to Notification of First Office Action for CN202211396677.2, w/ replacement claims, dated May 5, 2023.
Beijing Orient Institute of Measurement and Test (Applicant), Supplemental Reply to Notification of First Office Action for CN202211396677.2, w/ (allowed) replacement claims, dated May 17, 2023.
CNIPA, Notification to grant patent right for invention in CN202211396677.2, dated May 31, 2023.

* cited by examiner

ANECHOIC CHAMBER AND CONSTRUCTION METHOD THEREOF

TECHNICAL FIELD

The disclosure relates to the field of electromagnetic field tests, and more particularly to an anechoic chamber and a construction method thereof.

BACKGROUND

A mirror monoconical system is an important system in a transient electromagnetic field, and has multipurpose in a defense electronics field. The mirror monoconical system needs a surrounding with no reflection or low reflection. In this case, it is necessary to place the system in a very open outdoor, which is obviously not a good choice because the sun and rain will damage the equipment and problems of power supply and maintenance are also great. Another choice is to construct an anechoic chamber, and a main function of the anechoic chamber is to construct a monoconical transverse electromagnetic (TEM) cell with a low reflection. The traditional anechoic chamber is mostly rectangular in shape, with a shell made of steel plates, the steel plates themselves have a strong reflection effect on electromagnetic waves, resulting in strong multipath components with multiple reflections.

When the reflection effect is not suppressed, multiple reflections are generated on surfaces of the steel plates by a pulse electromagnetic field, so as to make the pulse electromagnetic field generate a strong inter-symbol interference characteristic, which is a serious negative factor. Therefore, in order to prevent this situation from happening, it is necessary to lay a matching structure with ferrite absorbing materials and pyramidal absorbing materials on the steel plates, and the matching structure can absorb most electromagnetic waves, so as to reduce a reflection level at a boundary of the matching structure.

In general, when an incident angle of the electromagnetic wave into the absorbing material is 0, a reflectivity of the absorbing material is lowest. Traditional rectangular anechoic chambers and cylindrical anechoic chambers have higher primary interface reflectivity in some cases, making it increasingly difficult to meet testing requirements.

For that, Chinese patent with publication NO. CN109884569B provides a generation device for a standard field with small reflection and broadband, which relates to a hemispherical semi-anechoic chamber, in a situation of a spherical anechoic chamber, an incident angle of the electromagnetic wave into the absorbing material is zero, which can fully reduce the reflectivity. However, a surface of the hemispherical anechoic chamber is a curved surface, a casting process or a polygonal steel frame splicing process is used to construct an anechoic chamber in the industry at present, for the hemispherical anechoic chamber, multiple curved surfaces need to be manufactured, and the curved surfaces are spliced to construct the anechoic chamber, costs of the cutting and splicing processes are expensive and the cutting and splicing processes are complicated to realize, it can be seen that the construction of the hemispherical anechoic chamber is almost impossible to achieve in engineering. Meanwhile, since a bottom surface of the absorbing material is a flat surface, for the hemispherical anechoic chamber, an inner wall is a curved surface, it is difficult to dispose the absorbing material on the inner wall of the hemispherical anechoic chamber. In summary, the patent is expensive in technical realization and difficult in construction, which is almost impossible to achieve.

SUMMARY

In view of this, the disclosure provides an anechoic chamber and a construction method thereof, to solve a problem that a reflectivity of the anechoic chamber cannot be balanced with a difficulty of its construction at present.

According to a first aspect, an embodiment of the disclosure provides an anechoic chamber, and the anechoic chamber includes a top surface, multiple trapezoid surfaces, multiple rectangular surfaces and an absorbing material.

The top surface is a polygon.

The multiple trapezoid surfaces correspond to edges of the top surface, respectively, a length of an upper edge of each of the multiple trapezoid surfaces is equal to a length of the corresponding edge of the top surface, each of the multiple trapezoid surfaces is connected to the corresponding edge of the top surface through the upper edge of the trapezoid surface, the multiple trapezoid surfaces are sequentially connected along a circumferential direction of the top surface, and each of the multiple trapezoidal surfaces is at an angle to the top surface.

The multiple rectangular surfaces correspond to the multiple trapezoid surfaces, respectively, a length of an upper edge of each of the multiple rectangular surfaces is equal to a length of a lower edge of the corresponding trapezoid surface, each of the multiple rectangular surfaces is connected to the lower edge of the corresponding trapezoid surface through the upper edge of the rectangular surface, the multiple rectangular surfaces are sequentially connected along a circumferential direction of the lower edges of the multiple trapezoid surfaces, and each of the multiple rectangular surfaces is perpendicular to the top surface.

The absorbing material is disposed on the top surface, the multiple trapezoid surfaces and the multiple rectangular surfaces.

In an embodiment, the top surface is a regular polygon.

In an embodiment, the top surface is a regular hexdecagon.

In an embodiment, the length of the lower edge of each of the multiple trapezoid surfaces is 1.2 meters (m).

In an embodiment, a radius of a ring surrounded by the multiple rectangular surfaces is 3.0755 m.

In an embodiment, a difference between a radius of the top surface and the radius of the ring surrounded by the multiple rectangular surfaces is 0.93 m.

In an embodiment, a height difference between the top surface and the upper edge of each of the multiple rectangular surfaces is 0.8 m.

According to a second aspect, the embodiment of the disclosure provides a construction method for anyone of the anechoic chambers described in the first aspect, and the construction method includes:

determining a reflectivity equation of the anechoic chamber; and determining, according to the reflectivity equation of the anechoic chamber, sizes of the top surface, the trapezoid surfaces and the rectangular surfaces of the anechoic chamber, determining a number of edges of the top surface, a number of the trapezoid surfaces and a number of the rectangular surfaces, and splicing the top surface, the trapezoid surfaces and the rectangular surfaces to construct the anechoic chamber.

In an embodiment, the determining a reflectivity equation of the anechoic chamber includes:

taking a center of the ring surrounded by the rectangular surfaces as an origin of a spherical coordinate system, taking the radius of the ring surrounded by the rectangular surfaces as an x-axis, and taking a height direction as a z-axis to construct the spherical coordinate system;

determining a radius of a bottom of a mirror monocone in the anechoic chamber, and determining a height of the anechoic chamber, the radius of the ring surrounded by the rectangular surfaces and a thickness of the absorbing material;

taking a vertical plane passing through a center of the anechoic chamber and passing through a radius of the top surface as a reference plane, recording a projection of a vertex of the ring surrounded by the rectangular surfaces on the reference plane as a point A, recording a projection of an intersection of the radius of the top surface and a boundary between a relevant area and an irrelevant area on the reference plane as a point C, recording a projection of a connection position between each of the rectangular surfaces and each of the trapezoid surfaces on the reference plane as a point D, recording a projection of a connection position between each of the trapezoid surfaces and the top surface on the reference plane as a point E, recording a projection of an end point of the absorbing material of one of the rectangular surfaces on the reference plane as a point $D_1$, and the end point of the absorbing material of the rectangular surface being located on a side of a contact surface connected with the rectangular surface and proximate to one of the trapezoid surfaces; and recording a projection of an end point of the absorbing material of the top surface on the reference surface as a point $E_1$, and the end point of the absorbing material of the top surface being located on a side of a contact surface connected with the top surface and proximate to one of the trapezoid surfaces.

In an embodiment, the reflectivity equation of the anechoic chamber is expressed as follows:

sents a radius of a cylindrical coordinate system converted from the spherical coordinate system.

The embodiment of the disclosure provides a novel equation, that is the reflectivity equation of the anechoic chamber, the sizes of the top surface, the rectangular surfaces, the trapezoid surfaces of the anechoic chamber, a number of polygonal edges of the top surface, the number of the trapezoid surfaces and the number of the rectangular surfaces can be determined by the reflectivity equation of the anechoic chamber, the anechoic chamber is obtained by splicing the top surface, the multiple trapezoid surfaces and the multiple rectangular surfaces, and the anechoic chamber is easy to process, and is easy to dispose the absorbing material, meanwhile, a reflectivity of the anechoic chamber can be effectively reduced.

BRIEF DESCRIPTION OF DRAWINGS

In order to provide a clearer explanation of technical solutions in embodiments of the disclosure or related art, drawings required in the embodiments will be simply introduced below. Apparently, the drawings in the following description are merely some of the embodiments of the disclosure, for those skilled in the art, other drawings can be obtained according to the drawings without creative work.

$$R_T = \int_{\theta_A}^{\theta_C} |S| R_l(\alpha(\theta)) ds$$

Figure 6:
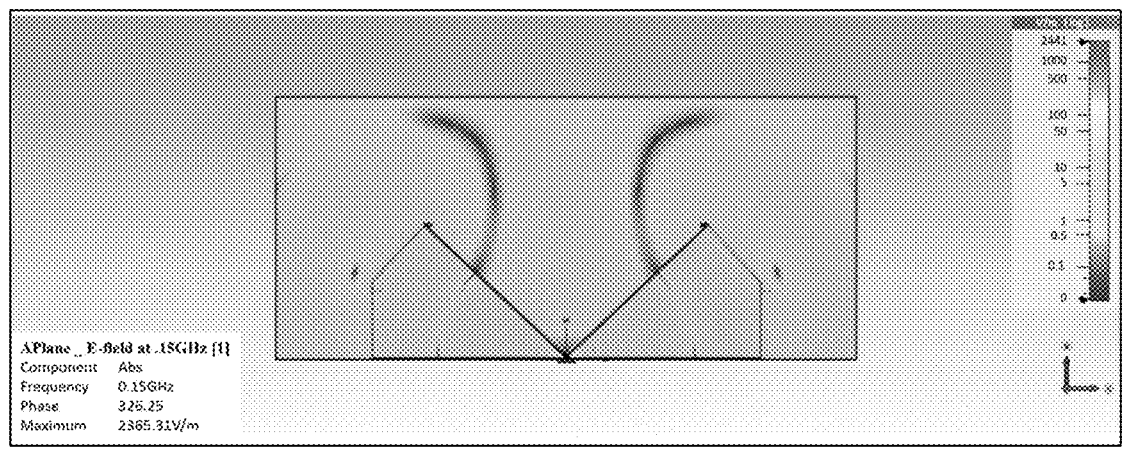

$$= \int_{\theta_A}^{\theta_{D1}} |S| R_l(\alpha(\theta)) ds + \int_{\theta_{D1}}^{\theta_{E1}} |S| R_l(\alpha(\theta)) ds + \int_{\theta_{E1}}^{\theta_C} |S| R_l(\alpha(\theta)) ds$$

$$= \frac{5}{12\pi} \left[ \int_{\theta_A}^{\theta_{D1}} \frac{2\pi\rho^2 \sec^2\theta R_l(\alpha(\theta))}{\rho^2} d\theta + \int_{\theta_A}^{\theta_{D1}} \frac{2\pi\rho^2 \sec^3\theta R_l(\alpha(\theta))}{\rho^2(\tan\theta - k_s)} d\theta + \int_{\theta_{E1}}^{\theta_C} \frac{2\pi\rho^2 R_l(\alpha(\theta))}{\rho^2 \cos\theta \sin\theta} d\theta \right]$$

$$= \frac{5}{6} \left[ \int_{\theta_A}^{\theta_{D1}} \sec^2\theta R_l(\alpha(\theta)) d\theta + \int_{\theta_A}^{\theta_{D1}} \frac{\sec^3\theta R_l(\alpha(\theta)) d\theta}{(\tan\theta - k_s)} + \int_{\theta_{E1}}^{\theta_C} \frac{R_l(\alpha(\theta)) d\theta}{\cos\theta \sin\theta} \right];$$

where $\theta_A$ represents an incident angle of the point A in the spherical coordinate system, $\theta_C$ represents an incident angle of the point C in the spherical coordinate system, $\theta_{D1}$ represents an incident angle of the point $D_1$ in the spherical coordinate system, $\theta_{E1}$ represents an incident angle of the point $E_1$ in the spherical coordinate system, $|S|$ represents an incident power density of an electromagnetic wave, $R_l(\alpha(\theta))$ represents a linear power dimensional transformation of a reflectivity of the absorbing material expressed as a function of an incident angle $\alpha$, $k_s$ represents an equation of a straight line $\overrightarrow{D_1E_1}$ in the spherical coordinate system, and $\rho$ repre- FIG. 6 illustrates a schematic diagram of a simulation analysis result under 0.15 GHz of a mirror monocone with a finite length according to an embodiment of the disclosure.

Figure 7:
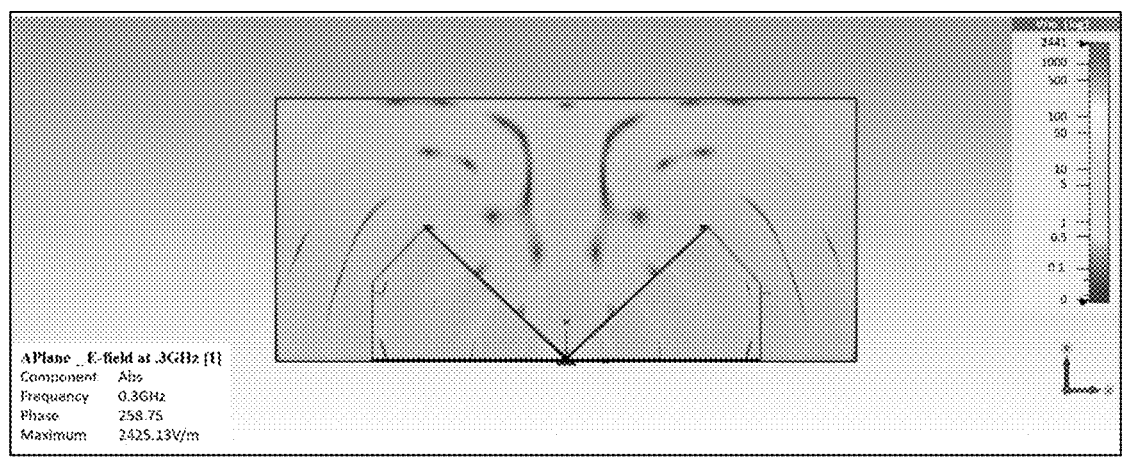

FIG. 7 illustrates a schematic diagram of a simulation analysis result under 0.3 GHz of a mirror monocone with a finite length according to an embodiment of the disclosure.

Figure 8:
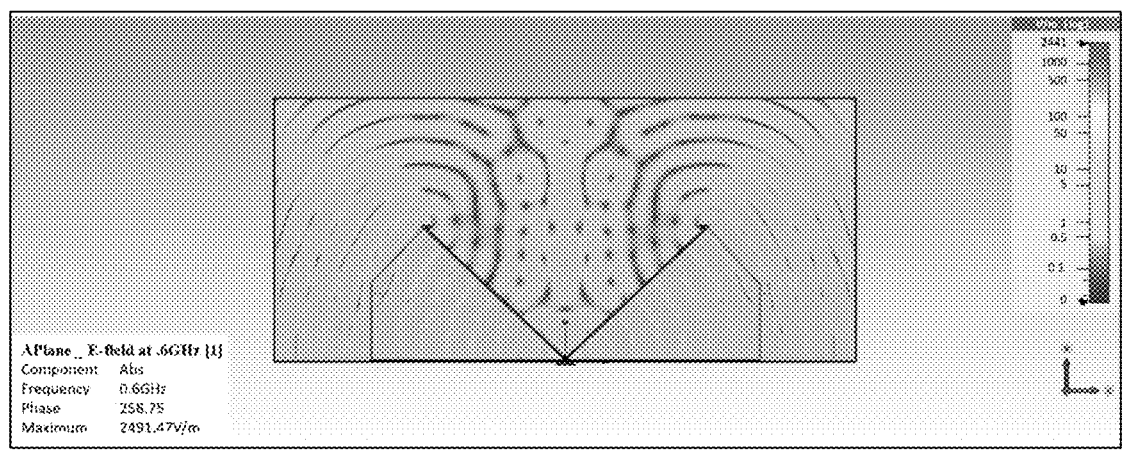

FIG. 8 illustrates a schematic diagram of a simulation analysis result under 0.6 GHz of a mirror monocone with a finite length according to an embodiment of the disclosure.

Figure 9:
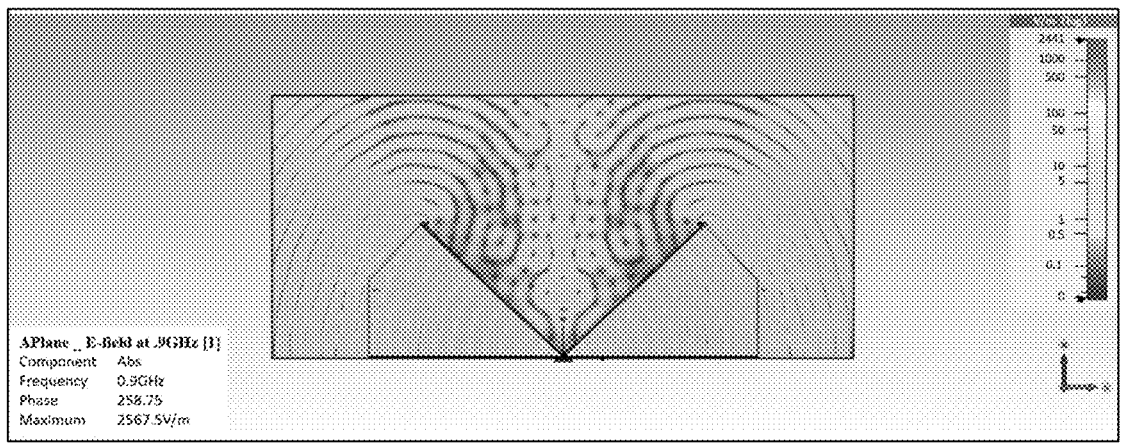

FIG. 9 illustrates a schematic diagram of a simulation analysis result under 0.9 GHz of a mirror monocone with a finite length according to an embodiment of the disclosure.

Figure 10:
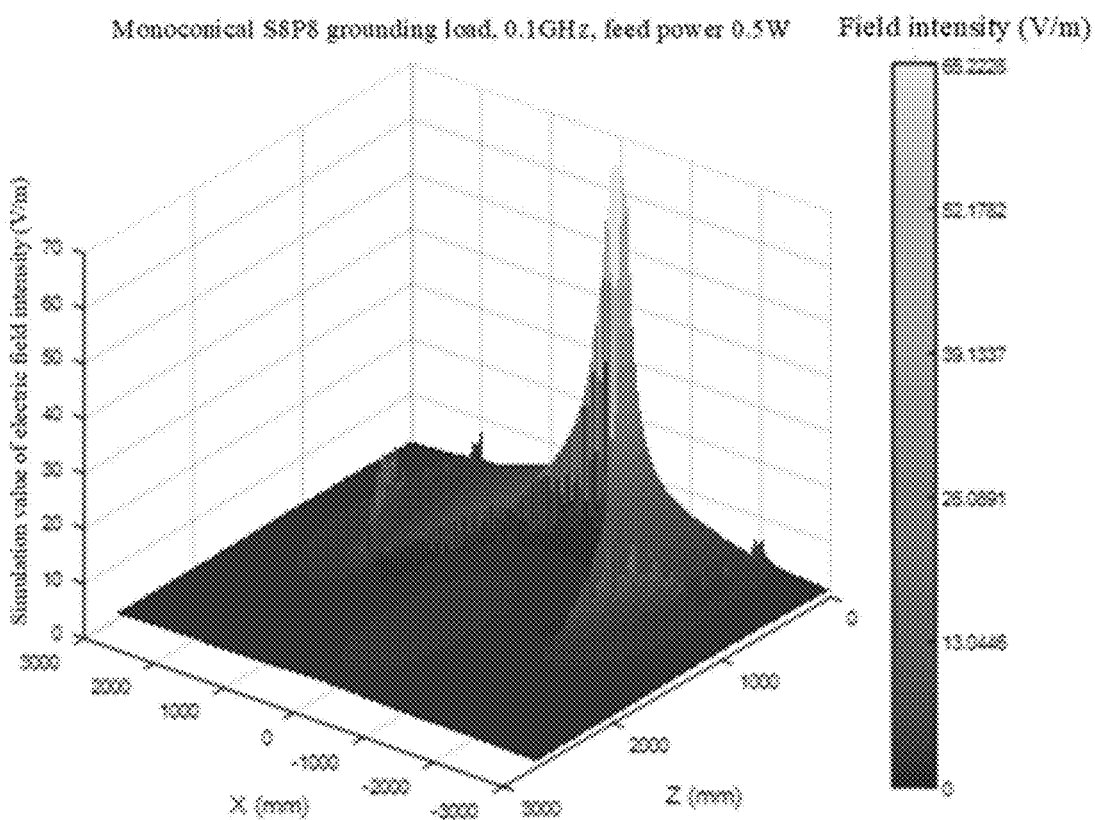

FIG. 10 illustrates a schematic diagram of a simulation result of an electric field intensity under 0.1 GHz of a straight line $CO_1$ according to an embodiment of the disclosure.

Figure 11:
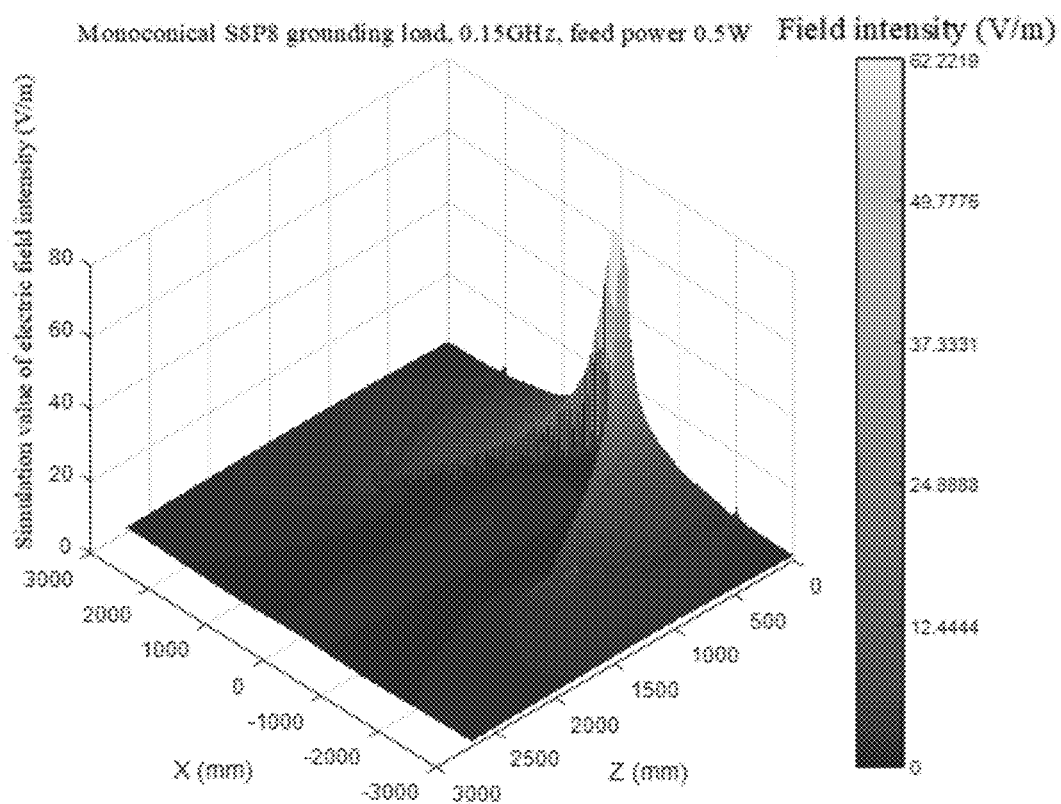

FIG. 11 illustrates a schematic diagram of a simulation result of an electric field intensity under 0.15 GHz of a straight line $CO_1$ according to an embodiment of the disclosure.

Figure 12:
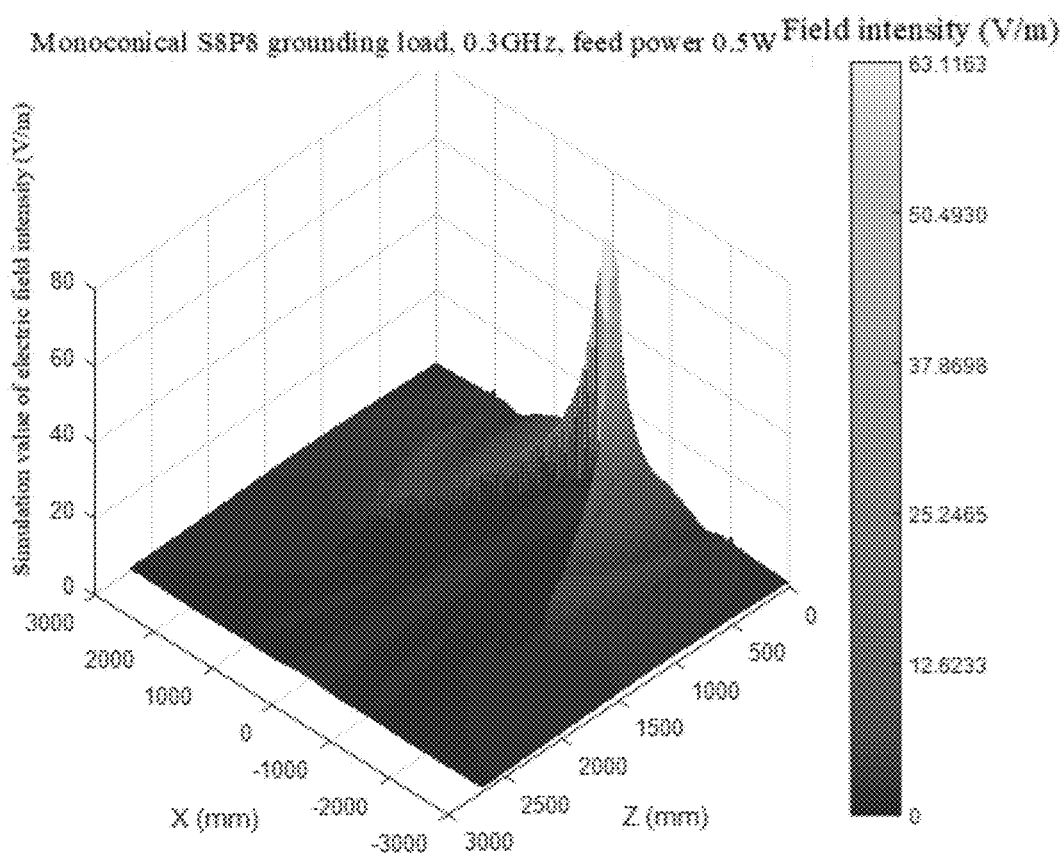

FIG. 12 illustrates a schematic diagram of a simulation result of an electric field intensity under 0.3 GHz of a straight line $CO_1$ according to an embodiment of the disclosure.

Figure 13:
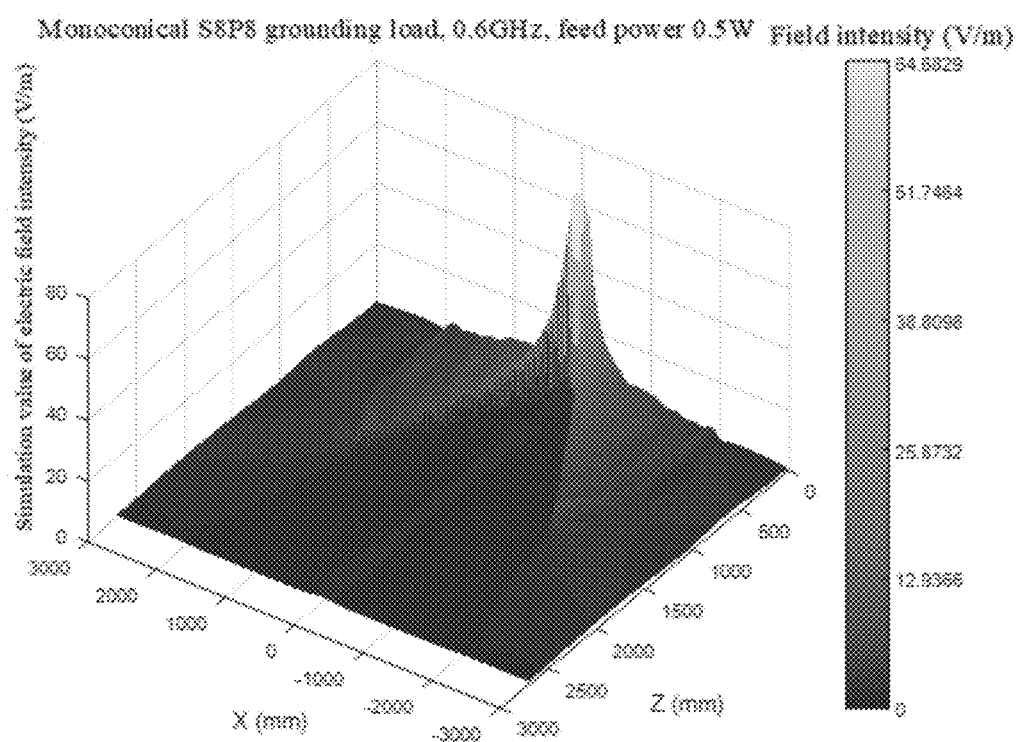

FIG. 13 illustrates a schematic diagram of a simulation result of an electric field intensity under 0.6 GHz of a straight line $CO_1$ according to an embodiment of the disclosure.

Figure 14:
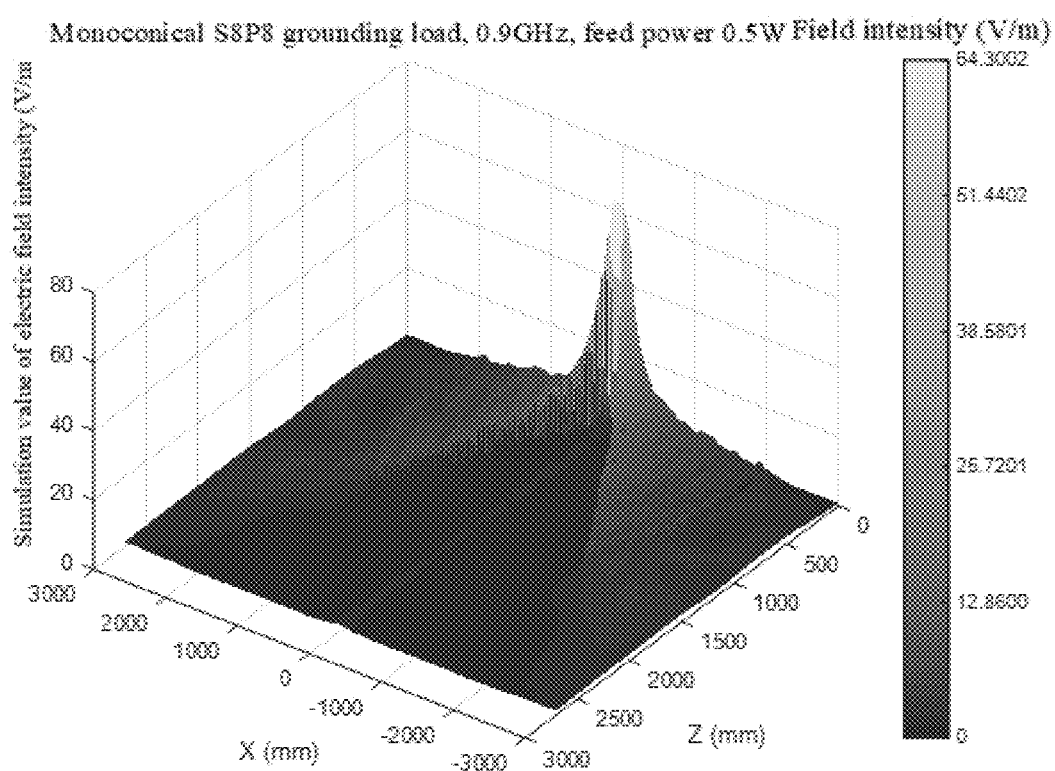

FIG. 14 illustrates a schematic diagram of a simulation result of an electric field intensity under 0.9 GHz of a straight line $CO_1$ according to an embodiment of the disclosure.

Figure 15:
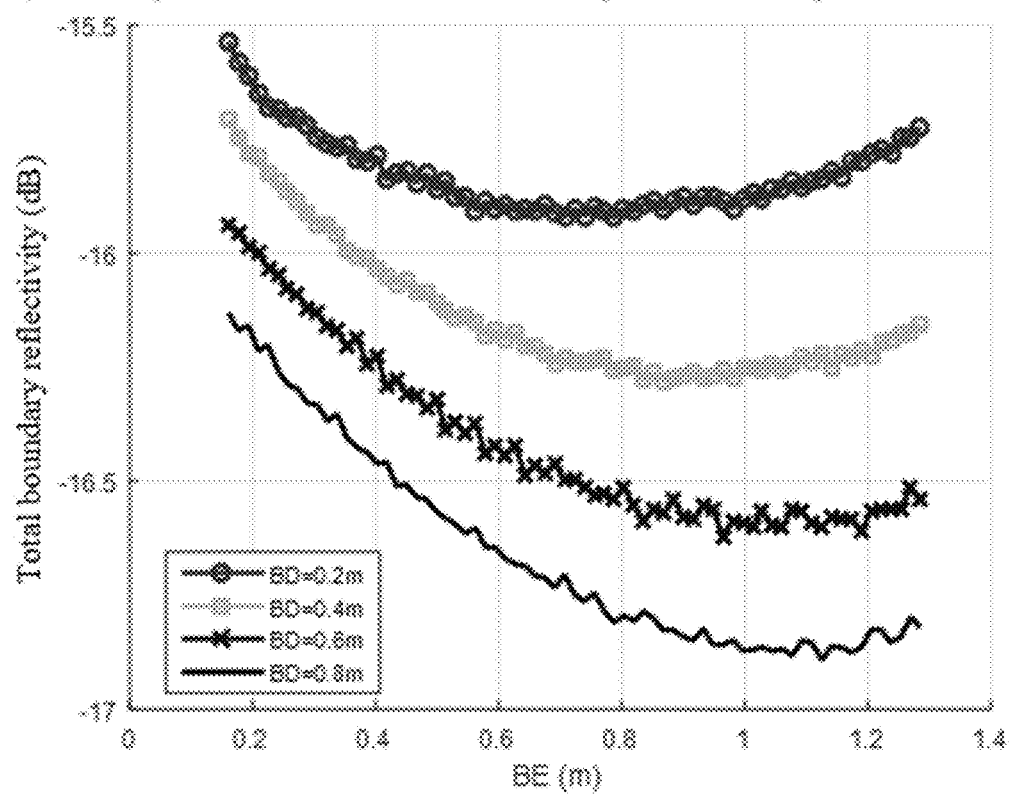

FIG. 15 illustrates a schematic diagram of a relationship between a reflectivity equation of the anechoic chamber and sizes of the anechoic chamber according to an embodiment of the disclosure.

DETAILED DESCRIPTION OF EMBODIMENTS

Descriptions of embodiments of the specification should be combined with corresponding drawings, and the drawings should be a part of the complete specification. In the drawings, a shape or a thickness in the embodiments can be expanded, and be marked with simplification or convenience. Moreover, parts of each structure in the drawings will be described separately for explanation, it is worth noting that components not shown in the drawings or not described through text are known to those skilled in the art.

The description of the embodiments here, any reference to direction and orientation, is only for convenience of description and cannot be understood as any limitation on a scope of protection of the disclosure. The following description of the embodiments will involve combinations of features that may exist independently or in combination, and the disclosure is not particularly limited to the embodiments. The scope of the disclosure is defined by claims.

Figure 1:
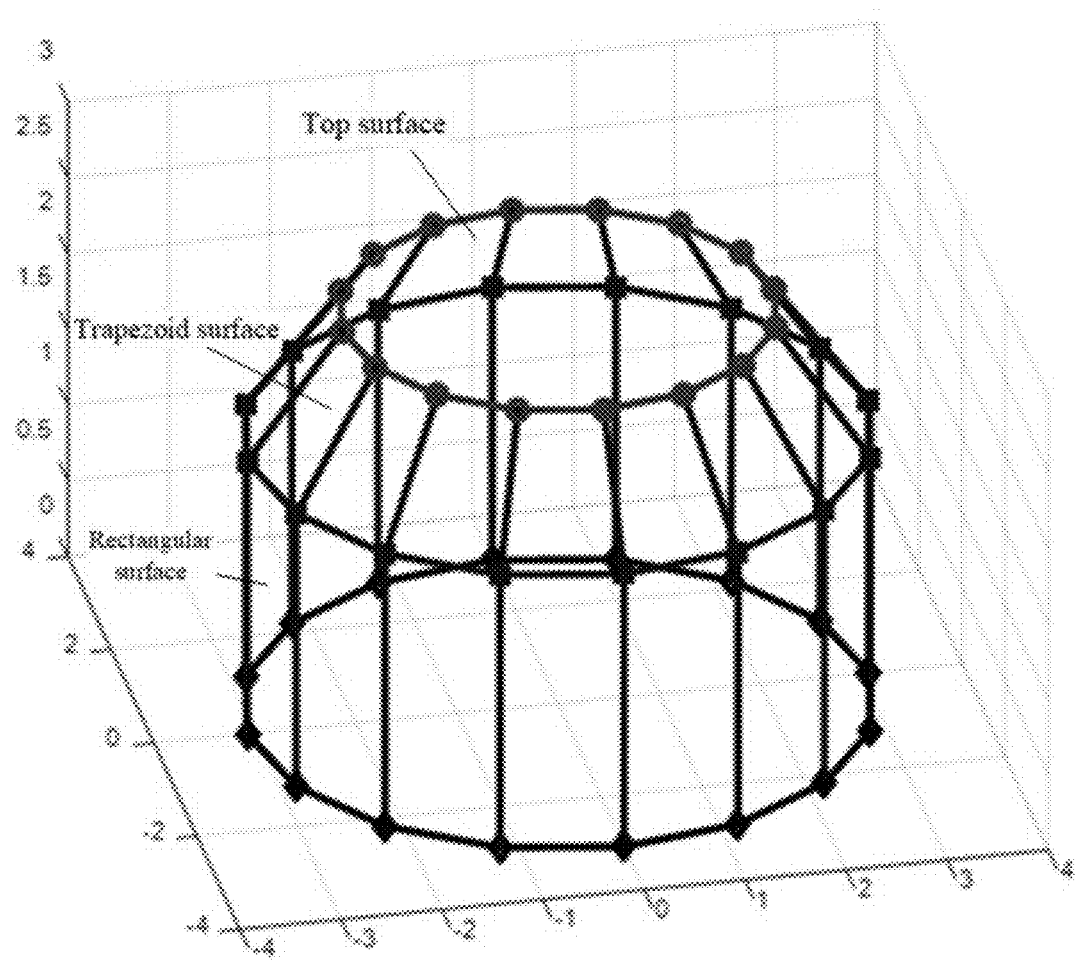
FIG. 1 illustrates a schematic diagram of a configuration of an anechoic chamber according to an embodiment of the disclosure.
Figure 2:
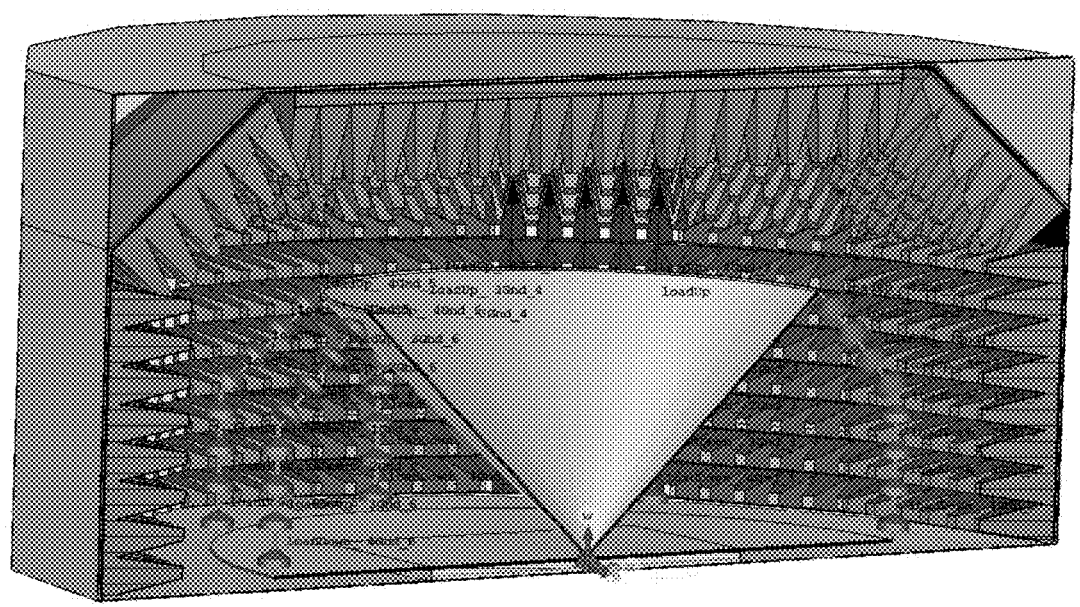
FIG. 2 illustrates an internal schematic structural diagram of the anechoic chamber according to an embodiment of the disclosure.

FIG. 1 and FIG. 2 illustrate schematic structural diagrams of an anechoic chamber in the embodiments of the disclosure. The anechoic chamber includes a top surface, multiple trapezoid surfaces, multiple rectangular surfaces and an absorbing material. The top surface is a polygon. The trapezoid surfaces correspond to edges of the top surface, respectively, a length of an upper edge of each trapezoid surface is equal to a length of the corresponding edge of the top surface, each trapezoid surface is connected to the corresponding edge of the top surface through the upper edge of the trapezoid surface, the trapezoid surfaces are sequentially connected along a circumferential direction of the top surface, and each trapezoidal surface is at an angle to the top surface. The rectangular surfaces correspond to the trapezoid surfaces, respectively, a length of an upper edge of each rectangular surface is equal to a length of a lower edge of the corresponding trapezoid surface, each rectangular surface is connected to the lower edge of the corresponding trapezoid surface through the upper edge of the rectangular surface, the rectangular surfaces are sequentially connected along a circumferential direction of the lower edges of the trapezoid surfaces, and each rectangular surface is perpendicular to the top surface. The absorbing material is disposed on the top surface, the trapezoid surfaces and the rectangular surfaces.

The anechoic chamber can be constructed by the following method, sizes of the top surface, the trapezoid surfaces, the rectangular surfaces of the anechoic chamber, a number of polygonal edges of the top surface, a number of the trapezoid surfaces and a number of the rectangular surfaces are determined according to a reflectivity equation of the anechoic chamber, and the top surface, the trapezoid surfaces and the rectangular surfaces are spliced to construct the anechoic chamber.

The embodiments of the disclosure provide a novel equation, that is the reflectivity equation of the anechoic chamber, the equation can be used to design and construct the anechoic chamber, and a derivation process of the reflectivity equation of the anechoic chamber is as follows.

A center of a ring surrounded by the rectangular surfaces is taken as an origin of a coordinate system (i.e., spherical coordinate system), a radius of the ring surrounded by the rectangular surfaces is taken as an x-axis, and a height direction is taken as a z-axis to construct a spherical coordinate system.

A radius of a bottom of a mirror monocone in the anechoic chamber is recorded as $r_c$, specifically, the mirror monocone is installed in the anechoic chamber through a way of a monoconical feed point proximate to ground, and the monoconical feed point is located at the z-axis of the spherical coordinate system.

A height of the anechoic chamber is recorded as H, and the radius of the ring surrounded by the rectangular surfaces is recoded as W, and a thickness of the absorbing material is recorded as L.

The top surface includes a relevant area and an irrelevant area, the irrelevant area is a part of the top surface covered by a projection of the mirror monocone on the top surface along the height direction, and the relevant area is a part of the top surface that is not covered by the projection of the mirror monocone on the top surface along the height direction.

Figure 3:
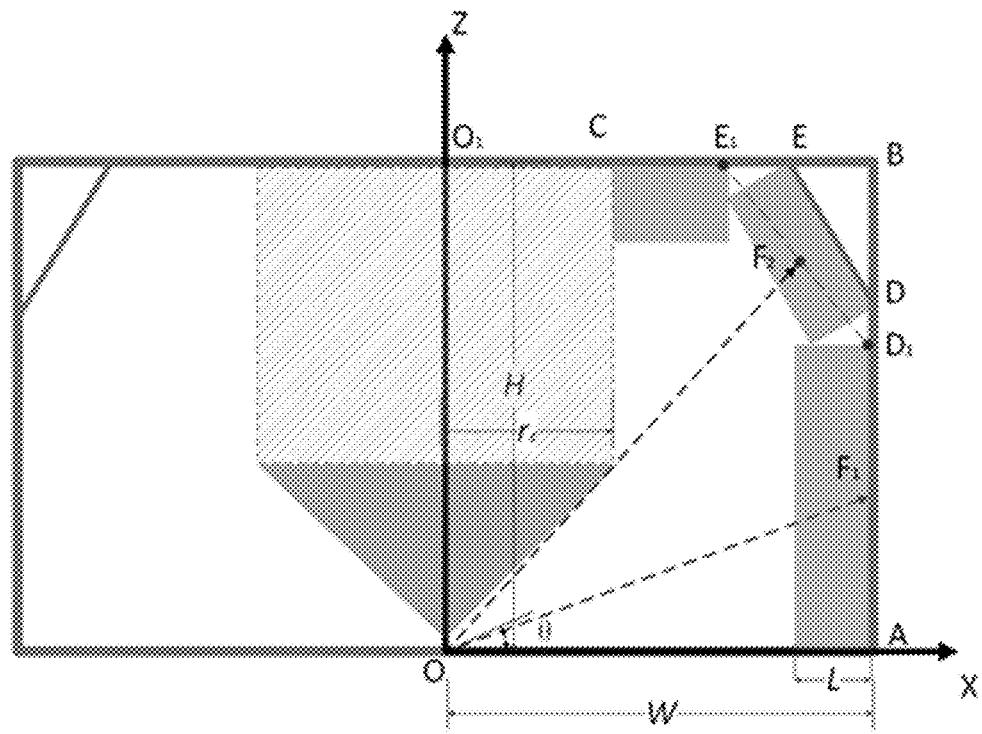
FIG. 3 illustrates a schematic diagram of a reference plane of the anechoic chamber according to an embodiment of the disclosure.

As shown in FIG. 3, a vertical plane passing through a center of the anechoic chamber and passing through a radius of the top surface is taken as a reference plane, a projection of a vertex of the ring surrounded by the rectangular surfaces on the reference plane is recorded as a point A, a projection of an intersection of the radius of the top surface and a boundary between the relevant area and the irrelevant area on the reference plane is recorded as a point C, a projection of a connection position between the rectangular surface and the trapezoid surface on the reference plane is recorded as a point D, a projection of a connection position between the trapezoid surface and the top surface on the reference plane is recorded as a point E, a projection of an end point of the absorbing material of the rectangular surface on the reference plane is recorded as a point $D_1$, and the end point of the absorbing material of the rectangular surface is located on a side of a contact surface connected with the rectangular surface and proximate to the trapezoid surface; and a projection of an end point of the absorbing material of the top surface on the reference surface is recorded as a point $E_1$, and the end point of the absorbing material of the top surface is located on a side of a contact surface connected with the top surface and proximate to the trapezoid surface.

Figure 4:
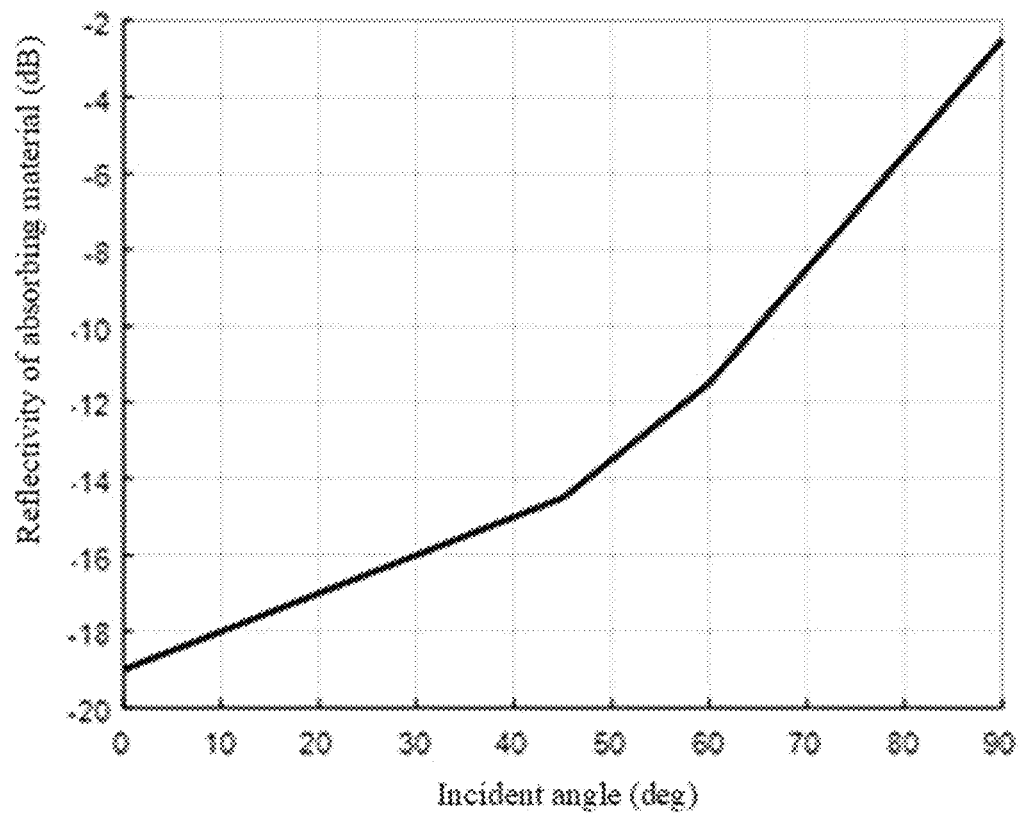
FIG. 4 illustrates a schematic diagram of a relationship between an incident angle of an absorbing material and a reflectivity growth rate according to an embodiment of the disclosure.
Figure 5:
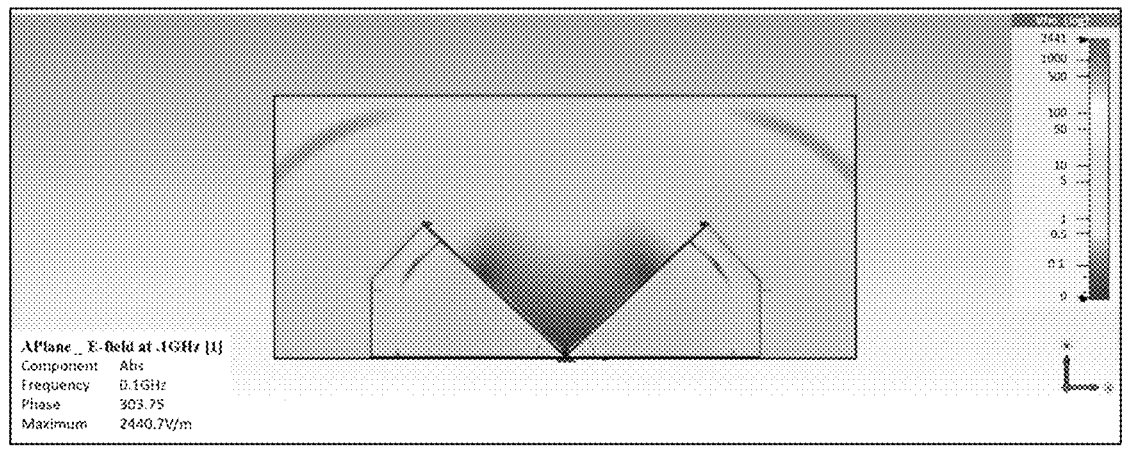
FIG. 5 illustrates a schematic diagram of a simulation analysis result under 0.1 gigahertz (GHz) of a mirror monocone with a finite length according to an embodiment of the disclosure.

As shown in FIG. 4, in general, a relationship between an incident angle on the absorbing material and a growth rate of the reflectivity is as follows: when the incident angle is in a range of 0°-45°, the growth rate is 0.1 decibel per degree (dB/°); when the incident angle is in a range of 450-60°, the growth rate is 0.2 dB/°; and when the incident angle is in a range of 600-90°, the growth rate is 0.3 dB/°.

The reflectivity of the absorbing material is expressed as a function of an incident angle $\alpha$, the function is recoded as $R_{(\alpha)}$, and an expression of the function $R_{(\alpha)}$ is expressed as follows:

$$R(\alpha)[dB] = R_0 - \begin{cases} 0.1\alpha & \alpha \in (0, 45] \\ 4.5 + 0.2(\alpha - 45) & \alpha \in (45, 60] \\ 7.5 + 0.3(\alpha - 60) & \alpha \in (60, 90] \end{cases}$$

where $R_0$ represents a reflectivity of the absorbing material when the incident angle is 0°.

The expression of $R_{(\alpha)}$ is converted to a linear power dimension, and the expression of $R_{(\alpha)}$ is expressed as follows:

$$R_l(\alpha) = 10^{\frac{R(\alpha)[dB]}{10}}.$$

where $R_0$ [dB] represents a reflectivity in a condition of vertical incidence, and an expression of $R_0$ [dB] is converted to a linear dimension and expressed as follows:

$$R_{0l} = 10^{\frac{R_0[dB]}{10}}.$$

An electric field of the mirror monocone is expressed as follows:

$$E(t) = \frac{V(t)}{r \sin \theta} \frac{2Z_c}{Z_c + Z_d};$$

where r represents a radius of the spherical coordinate system, $Z_d$ represents characteristic impedance of a transmission line, and $Z_c$ represents characteristic impedance of a monocone.

In general, $Z_d = Z_c$ in engineering, therefore, $Z_d = Z_c$ is uses as an example to describe in the embodiment, however, this is not intended to limit the embodiment (those skilled in the art can reasonably deduce results when $Z_d$ and $Z_c$ are not equal based on the records of the embodiment), make $Z_d = Z_c$ here, and the electric field of the mirror monocone is expressed as follows:

$$E(t) = \frac{V(t)}{r \sin \theta}.$$

the expression of the electric field of the mirror monocone is converted to be expressed in a cylindrical coordinate system as follows:

$$E(t) = \frac{V(t)}{\rho};$$

where $\rho$ represents a radius of the cylindrical coordinate system.

It should be noted that the above expressions are rule formulas of a mirror monocone with an infinite length, and there is no analytical solution for a mirror monocone with a finite length at present. The following simulation is made through a simulation analysis to obtain simulation results in a case of the mirror monocone with the finite length.

FIGS. 5-9 illustrate schematic diagrams of results obtained by analyzing multiple frequency points of the mirror monocone with the finite length through the simulation analysis, and FIGS. 5-9 respectively show analysis results under 0.1 gigahertz (GHz), 0.15 GHz, 0.3 GHz, 0.6 GHz and 0.9 GHz. It can be inferred from the above analysis results, due to a conical shading effect, an electric field intensity between a straight line $CO_1$ (see FIG. 3) is much smaller than other areas, specifically, simulation results of the electric field intensity are shown in FIGS. 10-14.

Therefore, when analyzing a total reflection power ratio of the anechoic chamber, the straight line $CO_1$ should not be included, and only three straight lines $\overrightarrow{AD_1}$, $\overrightarrow{D_1E_1}$, and $\overrightarrow{E_1C}$ are analyzed.

In the spherical coordinate system, a coordinate of the point A is A=(W, 0), and an incident angle $\theta_A$ of the point A is $\theta_A = 0$.

In the spherical coordinate system, a coordinate of the point C is C=($r_c$, H), and an incident angle $\theta_c$ of the point C is $\theta_c = \text{angle}(r_c + jH)$.

In the spherical coordinate system, a coordinate of the point $D_1$ is $D_1 = (x_{D1}, z_{D1})$ (W, H–BD–L sin $\beta_C$), and an incident angle $\theta_{D1}$ of the point D is $\theta_{D1}$ angle($x_{D1}+jz_{D1}$).

In the spherical coordinate system, a coordinate of the point $E_1$ is $E_1 = (x_{E1}, z_{E1})$ (W–BE–L cos $\beta_c$, H), and an incident angle $\theta_{E1}$ of the point E is $\theta_{E1}$ angle($x_{E1}+jz_{E1}$).

A complementary angle of the incident angle of the point C is $\beta_C = \arctan\left(\frac{|BE|}{|BD|}\right)$.

An incident angle of an electromagnetic wave is recorded as $\alpha$, on the straight line $\overrightarrow{AD_1}$, $\alpha = \theta$, and $\rho = W$; on the straight line $\overrightarrow{D_1E_1}$, a unit vector of a vector $\overrightarrow{OF_2}$ is expressed as $(\cos\theta, \sin\theta)$, and a formula of the incident angle $\alpha$ is expressed as follows:

$$\alpha = \left| \arcsin\left( \frac{\overrightarrow{(\cos \theta, \sin \theta)} \cdot \overrightarrow{D_1E_1}}{|\overrightarrow{D_1E_1}|} \right) \right|;$$

an equation of the straight line $\overrightarrow{D_1E_1}$ is expressed as follows:

$$k_s = \frac{z_{E1} - z_{D1}}{x_{E1} - x_{D1}};$$

the equation is solved to obtain the following formulas:

$$\begin{cases} z = k_s(x - x_{D1}) + z_{D1} \\ z = x \tan \theta \end{cases} ; \text{ and}$$

a formula of the radius of the cylindrical coordinate system is obtained and expressed as follows:

$$\rho = x = \frac{z_{D1} - k_s x_{D1}}{\tan\theta - k_s}.$$

On the straight line $\overrightarrow{E_1 C}$, $\alpha = 90 - \theta$, and $\rho = H \cot\theta$; and a formula of a feed power is expressed as follows:

$$P_{in} = \frac{v^2}{z_d};$$

a formula of an incident power density of the electromagnetic wave is obtained and expressed as follows:

$$|S| = \frac{E^2}{120\pi}.$$

Meanwhile, it takes into account that $\theta$ is actually a variable in the spherical coordinate system, and a formula of a surface integral is expressed as follows:

$$ds = 2\pi x \sqrt{(dx)^2 + (dz)^2}.$$

On the straight line $\overrightarrow{AD_1}$, $z = x \tan\theta$, $dx = 0$, $ds = 2\pi x^2 \sec^2\theta\, d\theta$, where $\theta \in [\theta_A, \theta_{D1}]$.

On the straight line $\overrightarrow{D_1 E_1}$, $$\begin{cases} x = \dfrac{z_{D1} - k_s x_{D1}}{\tan\theta - k_s} \\ z = x \tan\theta \\ ds = 2\pi x \sqrt{1 + \tan^2\theta}\, dx = 2\pi x \sec\theta\, dx = 2\pi x \sec^3\theta \dfrac{(z_{D1} - k_s x_{D1})d\theta}{(\tan\theta - k_s)^2} = \dfrac{2\pi x^2 \sec^3\theta\, d\theta}{\tan\theta - k_s} \end{cases};$$

where $\theta \in [\theta_{D1}, \theta_{E1}]$.

On the straight line $\overrightarrow{E_1 C}$, $dz = 0$, $x = z \cot\theta$, $ds = 2\pi xz \csc^2\theta$, and $$d\theta = \frac{2\pi x^2 d\theta}{\cos\theta \sin\theta},$$

where $\theta \in [\theta_{E1}, \theta_C)$.

The reflectivity equation of the anechoic chamber can be expressed as follows:

$$R_T = \int_{\theta_A}^{\theta_C} |S| R_l(\alpha(\theta)) ds =$$

$$\int_{\theta_A}^{\theta_{D1}} |S| R_l(\alpha(\theta)) ds + \int_{\theta_{D1}}^{\theta_{E1}} |S| R_l(\alpha(\theta)) ds + \int_{\theta_{E1}}^{\theta_C} |S| R_l(\alpha(\theta)) ds =$$

$$\frac{5}{12\pi}\left[\int_{\theta_A}^{\theta_{D1}} \frac{2\pi\rho^2 \sec^2\theta\, R_l(\alpha(\theta))}{\rho^2} d\theta + \int_{\theta_A}^{\theta_{D1}} \frac{2\pi\rho^2 \sec^3\theta\, R_l(\alpha(\theta))}{\rho^2(\tan\theta - k_s)} d\theta + \right.$$

$$\left. \int_{\theta_{E1}}^{\theta_C} \frac{2\pi\rho^2 R_l(\alpha(\theta))}{\rho^2 \cos\theta \sin\theta} d\theta \right] = \frac{5}{6}\left[\int_{\theta_A}^{\theta_{D1}} \sec^2\theta\, R_l(\alpha(\theta)) d\theta + \right.$$

$$\left. \int_{\theta_A}^{\theta_{D1}} \frac{\sec^3\theta\, R_l(\alpha(\theta)) d\theta}{(\tan\theta - k_s)} + \int_{\theta_{E1}}^{\theta_C} \frac{R_l(\alpha(\theta)) d\theta}{\cos\theta \sin\theta} \right].$$

It should be noted that in the above derivation processes, attention should be paid to in the engineering, $Z_d = Z_c$, for example, $Z_d = Z_c = 50\Omega$. Meanwhile, attention should be paid to normalization of the feed power, that is, in a situation that the feed power is 1 watt (W), the formula of the feed power is expressed as follows:

$$P_{in} = \frac{v^2}{z_d} = \frac{v^2}{50} = 1.$$

Therefore, according to parameters (e.g., the radius and the height of the mirror monocone, which are known parameters) of a tested mirror monocone and parameters (e.g., the height of the anechoic chamber and the thickness of the absorbing material, which are known parameters) of the anechoic chamber, and the above parameters are substituted into the above formulas to obtain a relationship between the reflectivity of the anechoic chamber and size parameters of the anechoic chamber. Specifically, the known data such as the parameters of the mirror monocone is substituted into the above formulas to obtain length values of BE and BD, and the size parameters of the top surface, the trapezoid surfaces and the rectangular surfaces, the number of the polygon edges of the top surface, the number of the trapezoid surfaces and the number of the rectangular surfaces are determined by those skilled in the art combining actual engineering needs (e.g., a size of a site and a size of an inner space of the anechoic chamber), so as to design a corresponding cutting solution, and the cutting solution refers to construct the anechoic chamber through a steel plate cutting process and a splicing technology, that is to construct the anechoic chamber through splicing the top surface, the trapezoid surfaces and the rectangular surfaces. The following example illustrates an operation example of constructing an anechoic chamber according to the above formulas.

As shown in FIG. 15, the embodiment takes an anechoic chamber with a height of 2.6 m, a maximum radius of 3.07 m, and a thickness of an absorbing material of 0.5 m as an example, and in the example, a generatrix of a mirror monocone is 2 m, and values of BD are individually selected as 0.2 m, 0.4 m, 0.6 m and 0.8 m, thus a curve of a reflectivity equation of the anechoic chamber can be represented as a curve shown in FIG. 15. It can be seen that when the value of BD is large, a total reflectivity in a boundary is low, however, with changes of the value of BD, the absorbing material at the boundary of the anechoic chamber may have an impact on entering experimenters. Therefore, after comprehensive consideration, the embodiment selects BD=0.8 m, and BE=0.93 m, with considering factors such as performances of the anechoic chamber, the size of the construction site, the size of the mirror monocone, the difficulty of construction, and the subsequent entry of experimenters into the inner space of the anechoic chamber, it is inferred that the anechoic chamber should be designed as a regular hexdecagon, that is, the top surface is the regular hexdecagon, the number of the trapezoid surfaces and the rectangular surfaces are sixteen, meanwhile, the length of the lower edge of the trapezoid surface is 1.2 m, the radius of the ring surrounded by the rectangular surfaces is 3.0755 m, and an electromagnetic absorption effect is the best at this time.

In terms of engineering implementation, the trapezoid surfaces and the rectangular surfaces can be spliced with the top surface through a splicing method to construct the anechoic chamber, the top surface, the trapezoid surfaces and the rectangular surfaces are flat surfaces, which can reduce costs (include cutting costs and manufacturing costs), moreover, it is easy to process, and is easy to dispose the absorbing material. Compared to the hemispherical anechoic chamber in the related art, the hemispherical anechoic chamber uses a hemispherical surface as a curved surface, which is difficult to cut and splice, and the absorbing material is difficult to be disposed on the curved surface, therefore, the embodiment has apparent advantages.

Furthermore, it should be understood that the embodiment takes the construction of the regular hexdecagon anechoic chamber as the example to describe, which is not intended to limit the embodiment, those skilled in the art can freely design the shape of the anechoic chamber based on the reflectivity equation of the anechoic chamber in the embodiment and combined with practical engineering needs, which can be an arbitrary polygonal anechoic chamber.

The embodiment of the disclosure provides a design method of the anechoic chamber, especially deriving a completely novel equation, that is, the reflectivity equation of the anechoic chamber. The relationship between the size parameters (e.g., lengths of BD and BE) of the anechoic chamber and the reflectivity of the anechoic chamber can be calculated through the reflectivity equation of the anechoic chamber, so as to determine the length values of BD and BE that balance the size and reflectivity of the anechoic chamber, determine the size parameters of the top surface, the trapezoid surfaces, the rectangular surfaces of the anechoic chamber, the number of the edges of the top surface, the number of the trapezoid surfaces and the number of the rectangular surfaces, and provide data and theoretical basis for the construction of the anechoic chamber. The anechoic chamber of the embodiment of the disclosure combines low cost and low reflection, which can better satisfy the testing requirements of the anechoic chamber in engineering.

The above descriptions are merely the embodiments of the disclosure and is not intended to limit the disclosure, any modifications, equivalent substitutions, improvements and the like made within spirit and principles of the disclosure should be included in a scope of protection of the disclosure.

What is claimed is:

1. A construction method of an anechoic chamber, comprising:
   determining a reflectivity equation of the anechoic chamber;
   determining, according to the reflectivity equation of the anechoic chamber, sizes of a top surface, trapezoid surfaces and rectangular surfaces of the anechoic chamber, determining a number of edges of the top surface, a number of the trapezoid surfaces and a number of the rectangular surfaces; and
   splicing the top surface, the trapezoid surfaces and the rectangular surfaces to construct the anechoic chamber;
   wherein the determining a reflectivity equation of the anechoic chamber comprises:
   taking a center of a ring surrounded by the rectangular surfaces as an origin of a spherical coordinate system, taking a radius of the ring surrounded by the rectangular surfaces as an x-axis, and taking a height direction as a z-axis to construct the spherical coordinate system;
   determining a radius of a bottom of a mirror monocone in the anechoic chamber, and determining a height of the anechoic chamber, the radius of the ring surrounded by the rectangular surfaces and a thickness of an absorbing material; wherein the top surface comprises a relevant area and an irrelevant area, the irrelevant area is a part of the top surface covered by a projection of the mirror monocone on the top surface along the height direction, and the relevant area is a part of the top surface that is not covered by the projection of the mirror monocone on the top surface along the height direction;
   taking a vertical plane passing through a center of the anechoic chamber and passing through a radius of the top surface as a reference plane, recording a projection of a vertex of the ring surrounded by the rectangular surfaces on the reference plane as a point A, recording a projection of an intersection of a radius of the top surface and a boundary between the relevant area and the irrelevant area on the reference plane as a point C, recording a projection of a connection position between each of the rectangular surfaces and each of the trapezoid surfaces on the reference plane as a point D, recording a projection of a connection position between each of the trapezoid surfaces and the top surface on the reference plane as a point E, recording a projection of an end point of the absorbing material of one of the rectangular surfaces on the reference plane as a point $D_1$, and the end point of the absorbing material of the rectangular surface being located on a side of a contact surface connected with the rectangular surface and proximate to one of the trapezoid surfaces; and recording a projection of an end point of the absorbing material of the top surface on the reference surface as a point $E_1$, and the end point of the absorbing material of the top surface being located on a side of a contact surface connected with the top surface and proximate to the one of the trapezoid surfaces; and
   wherein the reflectively equation of the anechoic chamber is expressed as follows:

$$R_T = \int_{\theta_A}^{\theta_C} |S| R_l(\alpha(\theta)) ds =$$

$$\int_{\theta_A}^{\theta_{D1}} |S| R_l(\alpha(\theta)) ds + \int_{\theta_{D_1}}^{\theta_{E1}} |S| R_l(\alpha(\theta)) ds + \int_{\theta_{E_1}}^{\theta_C} |S| R_l(\alpha(\theta)) ds =$$

$$\frac{5}{12\pi} \left[ \int_{\theta_A}^{\theta_{D1}} \frac{2\pi \rho^2 \sec^2\theta \, R_l(\alpha(\theta))}{\rho^2} d\theta + \int_{\theta_A}^{\theta_{D1}} \frac{2\pi \rho^2 \sec^3\theta \, R_l(\alpha(\theta))}{\rho^2 (\tan\theta - k_s)} d\theta + \int_{\theta_{E_1}}^{\theta_C} \frac{2\pi \rho^2 R_l(\alpha(\theta))}{\rho^2 \cos\theta \sin\theta} d\theta \right] = \frac{5}{6} \left[ \int_{\theta_A}^{\theta_{D1}} \sec^2\theta \, R_l(\alpha(\theta)) d\theta + \int_{\theta_A}^{\theta_{D1}} \frac{\sec^3\theta R_l(\alpha(\theta)) d\theta}{(\tan\theta - k_s)} + \int_{\theta_{E_1}}^{\theta_C} \frac{R_l(\alpha(\theta)) d\theta}{\cos\theta \sin\theta} \right];$$

wherein $\theta_A$ represents an incident angle of the point A in the spherical coordinate system, $\theta_C$ represents an incident angle of the point C in the spherical coordinate system, $\theta_{D1}$ represents an incident angle of the point $D_1$ in the spherical coordinate system, $\theta_{E1}$ represents an incident angle of the point $E_1$ in the spherical coordinate system, |S| represents an incident power density of an electromagnetic wave, $R_l(\alpha(\theta))$ represents a linear power dimensional transformation of a reflectivity of the absorbing material expressed as a function of an incident angle $\alpha$, $k_s$ represents an equation of a straight line $\overrightarrow{D_1E_1}$ in the spherical coordinate system, and $\rho$ represents a radius of a cylindrical coordinate system converted from the spherical coordinate system.

2. The anechoic chamber constructed by the construction method of the anechoic chamber as claimed in claim 1, comprising:

the top surface, being a regular polygon;

the trapezoid surfaces, corresponding to the edges of the top surface, respectively, wherein a length of an upper edge of each of the trapezoid surfaces is equal to a length of the corresponding edge of the top surface, each of the trapezoid surfaces is connected to the corresponding edge of the top surface through the upper edge of the trapezoid surface, the trapezoid surfaces are sequentially connected along a circumferential direction of the top surface, and each of the trapezoidal surfaces is at an angle to the top surface;

the rectangular surfaces, corresponding to the trapezoid surfaces, respectively, wherein a length of an upper edge of each of the rectangular surfaces is equal to a length of a lower edge of the corresponding trapezoid surface, each of the rectangular surfaces is connected to the lower edge of the corresponding trapezoid surface through the upper edge of the rectangular surface, the rectangular surfaces are sequentially connected along a circumferential direction of the lower edges of the trapezoid surfaces, and each of the rectangular surfaces is perpendicular to the top surface; and an absorbing material, disposed on the top surface, the trapezoid surfaces and the rectangular surfaces.

3. The anechoic chamber as claimed in claim 2, wherein the top surface is a regular hexdecagon.

4. The anechoic chamber as claimed in claim 2, wherein the length of the lower edge of each of the trapezoid surfaces is 1.2 meters (m).

5. The anechoic chamber as claimed in claim 2, wherein the radius of the ring surrounded by the rectangular surfaces is 3.0755 m.

6. The anechoic chamber as claimed in claim 2, wherein a difference between the radius of the top surface and the radius of the ring surrounded by the rectangular surfaces is 0.93 m.

7. The anechoic chamber as claimed in claim 2, wherein a height difference between the top surface and the upper edge of each of the rectangular surfaces is 0.8 m.

* * * * *